(12) United States Patent
Yamauchi et al.

(10) Patent No.: US 12,412,620 B2
(45) Date of Patent: *Sep. 9, 2025

(54) SECOND WORD LINE COMBINED WITH Y-MUX SIGNAL IN HIGH VOLTAGE MEMORY PROGRAM

(71) Applicant: Taiwan Semiconductor Manufacturing Company, Ltd., Hsinchu (TW)

(72) Inventors: Yoshitaka Yamauchi, Hsinchu (TW); Meng-Sheng Chang, Chu-bei (TW); Hiroki Noguchi, Hsinchu (TW); Perng-Fei Yuh, Walnut Creek, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,559

(22) Filed: Jul. 28, 2023

(65) Prior Publication Data

US 2023/0377629 A1 Nov. 23, 2023

Related U.S. Application Data

(63) Continuation of application No. 17/331,340, filed on May 26, 2021, now Pat. No. 11,763,875.

(51) Int. Cl.
*G11C 8/10* (2006.01)
*G11C 11/408* (2006.01)
(Continued)

(52) U.S. Cl.
CPC ...... *G11C 11/4087* (2013.01); *G11C 11/4085* (2013.01); *G11C 11/4094* (2013.01); *G11C 11/4096* (2013.01)

(58) Field of Classification Search
CPC ... G11C 17/14; G11C 17/165; G11C 13/0002; G11C 11/4087; G11C 11/4096
See application file for complete search history.

(56) References Cited

U.S. PATENT DOCUMENTS 7,206,247 B2 * 4/2007 Jenne ................... G11C 29/028
365/243
7,544,968 B1 * 6/2009 Toutounchi ............ H10B 20/00
257/50

(Continued)

FOREIGN PATENT DOCUMENTS

TW I345790 B 7/2011

OTHER PUBLICATIONS

Office Action issued in Taiwan Appl. No. 11013252 dated Apr. 23, 2025.

*Primary Examiner* — Mushfique Siddique
(74) *Attorney, Agent, or Firm* — FOLEY & LARDNER LLP (57) ABSTRACT

A memory device is disclosed. The memory device includes a plurality of memory cells arranged in a plurality of rows and a plurality of columns; a plurality of word lines, each of the word lines coupled to a corresponding row of the memory cells; a plurality of bit lines, each of the bit lines coupled to a corresponding column of the memory cells; and a plurality of second word lines, each of the second word lines coupled to a corresponding column of the memory cells.

20 Claims, 6 Drawing Sheets

(51) Int. Cl.
*G11C 11/4094* (2006.01)
*G11C 11/4096* (2006.01)

(56) References Cited

U.S. PATENT DOCUMENTS

| | | | | |
|---|---|---|---|---|
| 9,502,426 | B1* | 11/2016 | Kuo | H10D 84/038 |
| 10,777,288 | B2* | 9/2020 | Kurjanowicz | G11C 17/10 |
| 2005/0281071 | A1* | 12/2005 | Jeon | G11C 11/22 |
| | | | | 365/145 |
| 2007/0030719 | A1* | 2/2007 | Hoefler | G11C 17/18 |
| | | | | 257/E27.102 |
| 2008/0002504 | A1* | 1/2008 | Nakano | G11C 17/18 |
| | | | | 257/E23.149 |
| 2010/0118597 | A1 | 5/2010 | Song et al. | |
| 2013/0077377 | A1 | 3/2013 | Kim | |
| 2016/0148705 | A1 | 5/2016 | Lee et al. | |
| 2016/0189755 | A1 | 6/2016 | Hsiao | |
| 2017/0076757 | A1* | 3/2017 | Wu | G11C 11/24 |
| 2017/0372758 | A1 | 12/2017 | Hsiao | |
| 2018/0233182 | A1 | 8/2018 | Hsiao | |
| 2018/0233186 | A1 | 8/2018 | Hsiao | |

\* cited by examiner

SECOND WORD LINE COMBINED WITH Y-MUX SIGNAL IN HIGH VOLTAGE MEMORY PROGRAM

CROSS-REFERENCE TO RELATED APPLICATION

This application is a continuation application of U.S. patent application Ser. No. 17/331,340, filed on May 26, 2021, which is incorporated herein by reference in its entirety for all purposes.

BACKGROUND

A programmable read-only memory (PROM) is a form of digital memory where the setting of each bit is locked by a fuse, antifuse, eFuse, or any other of various fuse types. Like other read-only memories (ROMs), the data in the PROMs are permanent and cannot be changed. PROMs may be used in digital electronic devices to store permanent data, usually for low level programs such as firmware or microcode. A difference from a standard ROM is that the data is written into a ROM during manufacture, while data is programmed into a PROM after manufacture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For a memory array such as an eFuse or a one-time-programming (OTP) memory in core-only advanced process nodes, access transistors may be stacked for over-voltage stress protection. In some embodiments lacking the improvements disclosed herein, second word lines (SWLs) for the stacked access transistors are asserted in parallel with word lines (WLs). In such embodiments, all SWLs are asserted to protect stacked access transistors in unselected memory/bit cells. By activating all SWLs in every programming cycle, such embodiments incur higher active power for programming a memory cell of a memory array. What is needed is a device, system and method that reduces the active power in programming memory cells.

The present disclosure provides various embodiments of a memory device, system, and method that provide SWLs in parallel with bit lines (BLs) rather than in parallel with WLs. For example, each WL can be coupled to a corresponding row of a memory array, and each BL and SWL can be coupled to a corresponding column of the memory array. Each memory cell can include a first transistor (e.g., common source transistor) of the stacked access transistors that is coupled to the WL and a second transistor (e.g., cascode transistor) of the stacked access transistors that is coupled to the SWL. In some embodiments, low threshold voltage (LVT) devices can be used for the stacked access transistors. In some embodiments, the SWLs and the BLs are coupled to a same decoder. In some embodiments, second bit line (SBLs) are provided in parallel with WLs.

Advantageously, embodiments of the disclosed memory device, system, and method can achieve several benefits. In some embodiments, the disclosed memory device, system, and method can reduce capacitive loading, and therefore, active power in programming operation while protecting unselected stacked access transistors of memory cells coupled to the asserted BL. For example, for a 64×256 memory cell, the capacitive loading and active power can be 256 times lower than the capacitive loading and active power of embodiments lacking the improvements described herein. In some embodiments, the disclosed memory device, system, and method can further reduce the active power by using LVT devices and providing, through the WLs and SWLs, signals having lower voltage levels.

Embodiments of the disclosed memory device, system, and method can be applied to eFuse and OTP memory programming. Embodiments of the disclosed memory device, system, and method can be applied to high-voltage (HV) memory circuits, e.g., in a core-only, advanced process node.

Figure 1:
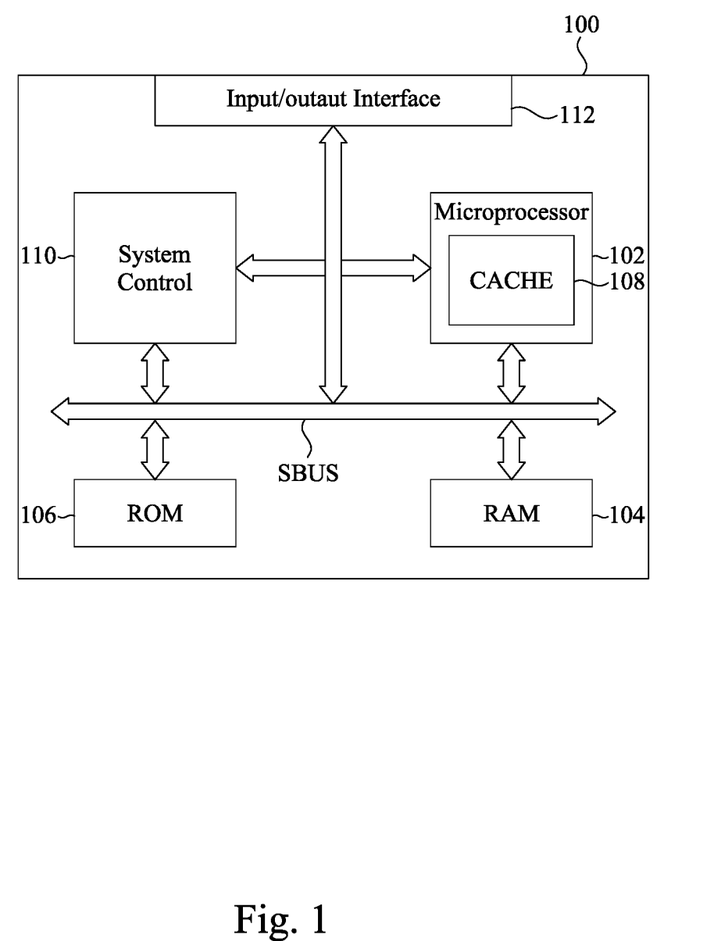
FIG. 1 illustrates a block diagram of an example of a large-scale integrated circuit, in accordance with some embodiments of the present disclosure.

FIG. 1 illustrates a block diagram of an example of a large-scale integrated circuit 100, in the form of a so-called "system-on-a-chip" ("SoC"), as used in various electronic systems. Integrated circuit 100 may be a single-chip integrated circuit into which an entire computer architecture is realized. As such, in this example, integrated circuit 100 includes a central processing unit of microprocessor 102, which is connected to system bus SBUS. Various memory resources, including random access memory (RAM) 104 and read-only memory (ROM) 106, reside on system bus SBUS and are thus accessible to microprocessor 102. ROM 106 may be realized as mask-programmed ROM, electrically erasable programmable read-only memory (EEPROM) such as "flash" EEPROM, or the like, and typically serves as program memory, storing the program instructions executable by microprocessor 102, while RAM 104 serves as data memory. In some cases, program instructions may reside in RAM 104 for recall and execution by microprocessor 102. Cache memory 108 (such as level 1, level 2, and level 3 caches, each typically implemented as SRAM) provides another memory resource and resides within microprocessor 102 itself and therefore does not require bus access. Other system functions are shown, in a generic sense, in integrated circuit 100 by way of system control 110 and input/output interface 112.

It is appreciated that integrated circuit 100 may include additional or alternative functions to those shown in FIG. 1 or may have its functions arranged according to a different architecture from that shown in FIG. 1. The architecture and functionality of integrated circuit 100 is thus provided only by way of example and is not intended to limit the scope of the present disclosure.

Figure 2:
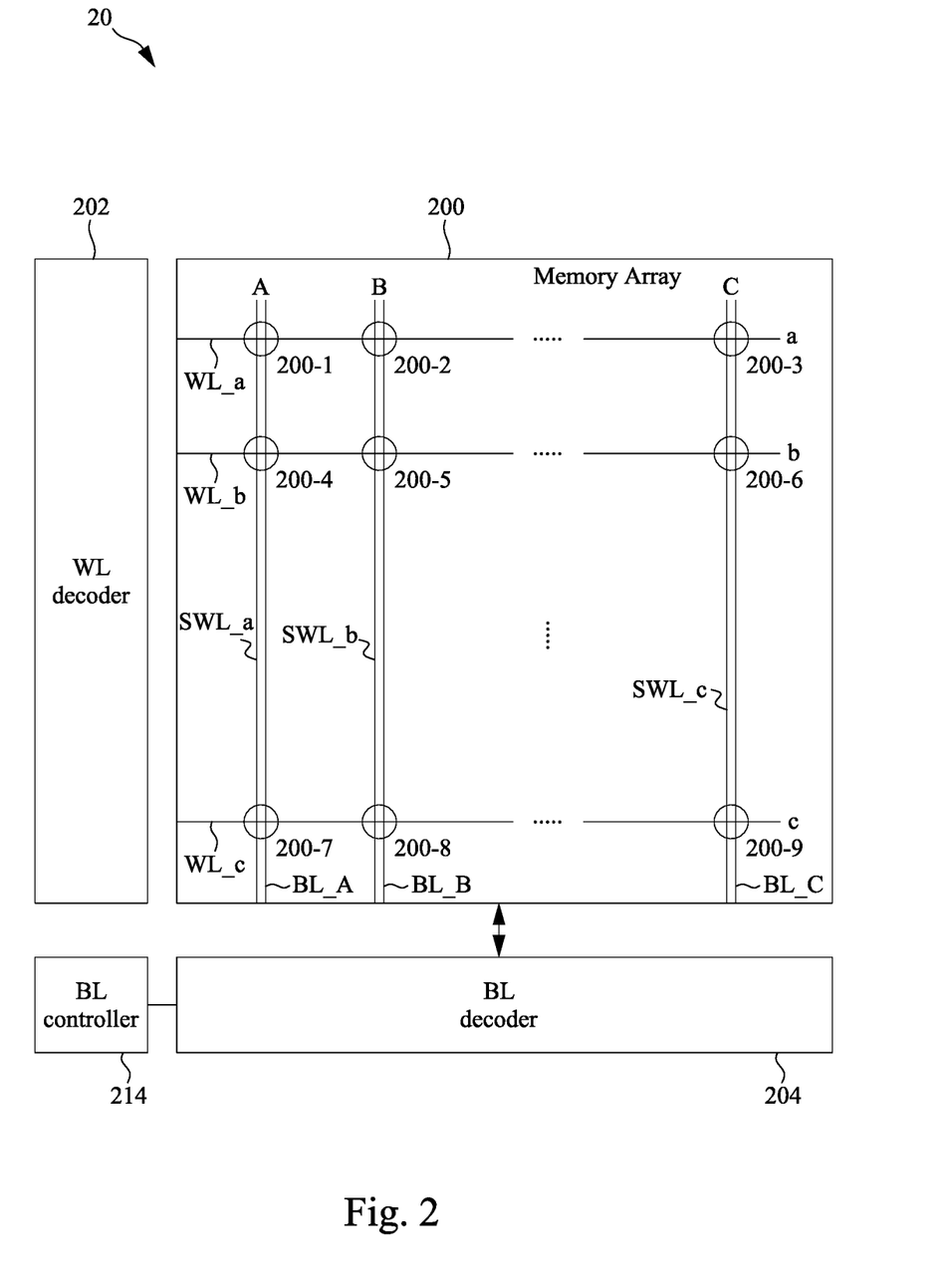
FIG. 2 illustrates a block diagram of a memory system, in accordance with some embodiments of the present disclosure.

FIG. 2 illustrates a block diagram of a memory system 20, in accordance with some embodiments of the present disclosure. The memory system 20 may be an embodiment of the RAM 104, the ROM 106, the cache memory 108, or the like. In some other embodiments, the memory system 20 may correspond to a stand-alone memory integrated circuit (i.e., rather than as an embedded memory as shown in FIG. 1).

As shown in FIG. 2, the memory system 20 includes memory array 200, word line (WL) decoder 202 operatively coupled to memory array 200, and bit line (BL) decoder 204 operatively coupled to memory array 200. Although memory array 200, WL decoder 202, and BL decoder 204 are illustrated as discrete components (blocks) in the illustrated embodiment of FIG. 1, at least two or more of the memory array 200, the WL decoder 202, and the BL decoder 204 may be integrated as a single component while remaining within the scope of the present disclosure. It is understood that the illustrated embodiment of the memory system 20 in FIG. 2 is simplified and thus, the memory system 20 can include one or more other blocks (or circuits) while remaining within the scope of the present disclosure. For example, the memory system 20 can include a row (e.g., WL) driver, a column (e.g., BL) driver, a WL tracking circuit, a BL tracking circuit, one or more input/output circuits (sense amplifiers), etc.

In some embodiments, memory array 200 may include a one-time-programmable (OTP) memory (e.g., programmable read-only memory (PROM)) array. However, any of a variety of memory arrays (e.g., a standard ROM memory array, a flash memory array, an electrically erasable PROM (EEPROM) array, a static random access memory (SRAM) array, a resistive random access memory (RRAM) array, a dynamic random access memory (DRAM) array, a magnetoresistive random access memory (MRAM) array, etc.) may be implemented as memory array 200 while remaining within the scope of the present disclosure.

The memory array 200 includes a plurality of memory cells arranged in a column-row configuration. For example, the memory array 200 includes a plurality of memory cells (e.g., 200-1, 200-2, 200-3, 200-4, 200-5, 200-6, 200-7, 200-8, 200-9, etc.) in which each column has a bit line (BL) and a second word line (SWL) and each row has a word line (WL). The BL and the SWL of each column are respectively coupled to a plurality of memory cells that are disposed in that column, and each memory cell in that column is arranged on a different row and coupled to a respective (different) WL. That is, each memory cell of the memory array 200 is coupled to a BL and a SWL of a column of the memory array 200, and a WL of a row of the memory array 200. In some embodiments, the BLs and SWLs are arranged in parallel vertically and the WLs are arranged in parallel horizontally (i.e., perpendicular to the BLs). Further detail shall be discussed below with respect to FIGS. 3-6.

Referring still to FIG. 2, and in greater detail, nine memory cells (e.g., 200-1, 200-2, 200-3, 200-4, 200-5, 200-6, 200-7, 200-8, 200-9) are shown in memory array 200 for illustration purposes. Based on the above description, columns "A," "B," and "C," and rows "a," "b," and "c" are accordingly shown in memory array 200. The memory cells 200-1, 200-4, and 200-7 are arranged along the column A; the memory cells 200-2, 200-5, and 200-8 are arranged along the column B; the memory cells 200-3, 200-6, and 200-9 are arranged along the column C; the memory cells 200-1, 200-2, and 200-3 are arranged along the row a; the memory cells 200-4, 200-5, and 200-6 are arranged along the row b; and the memory cells 200-7, 200-8, and 200-9 are arranged along the row c. Moreover, the memory cells 200-1, 200-4, and 200-7 arranged along column A are each coupled to a respective BL of the column A, "BL_A," the memory cells 200-1, 200-4, and 200-7 arranged along column A are each coupled to a respective SWL of column A, "SWL_A," and the memory cells 200-1, 200-4, and 200-7 arranged along column A are each coupled to a WL of the respective row: WL_a, WL_b, and WL_c; the memory cells 200-2, 200-5, and 200-8 arranged along the column B are each coupled to a respective BL of the column B, "BL_B," the memory cells 200-2, 200-5, and 200-8 arranged along the column B are each coupled to a respective SWL of column B, "SWL_B," and the memory cells 200-2, 200-5, and 200-8 arranged along the column B are each coupled to a WL of the respective row: WL_a, WL_b, and WL_c; the memory cells 200-3, 200-6, and 200-9 arranged along the column C are each coupled to a respective BL of the column C, "BL_C," the memory cells 200-3, 200-6, and 200-9 arranged along the column C are each coupled to a respective SWL of column C, "SWL_C," and the memory cells 200-3, 200-6, and 200-9 arranged along the column C are each coupled to a WL of the respective row: WL_a, WL_b, and WL_c.

Each memory cell of memory array 200 is configured to store/present a data bit, or a datum. Such a data bit may be repeatedly read out from (i.e., a read operation) or written to (i.e., a write operation) each bit cell with a respective logic state (i.e., either a logical 1 or a logical 0). Although the illustrated embodiment of FIG. 2 shows nine memory cells in the memory array 200, any desired number of memory cells may be included in the memory array 200 while remaining within the scope of the present disclosure. As such, the number of columns and rows (and corresponding BLs and WLs) can be adjusted in accordance with the number of memory cells in the memory array 200.

According to various embodiments of the present disclosure, the WL decoder 202 is a circuit that provides a voltage or a current through one or more WLs of the memory array 200. In one aspect, the BL decoder 204 is a circuit that provides a voltage or a current through one or more BLs (and in some embodiments, one or more SWLs) of the memory array 200. In some embodiments, the BL decoder 204 is embedded in or coupled to a BL controller 214 that is coupled to the memory array 200. In some embodiments, the BL controller 214 can sense a voltage or current from the memory array 200 through one or more BLs.

In one example, to write data to the memory cell 200-1, the WL decoder 202 applies a voltage or current to the memory cell 200-1 through a WL connected to the memory cell 200-1 (e.g., and, in some embodiments, through a SBL connected to the memory cell 200-1), and the BL decoder 204 applies a voltage or current corresponding to data to be stored to the memory cell 200-1 through a BL connected to the memory cell 200-1 (e.g., and, in some embodiments, through a SWL connected to the memory cell 200-1). In one example, to read data from a memory cell 200-1, the WL decoder 202 applies a voltage or a current to the memory cell 200-1 through a WL connected to the memory cell 200-1, and the BL controller 214 senses a voltage or current corresponding to data stored by the memory cell 200-1 through a BL connected to the memory cell 200-1. In some embodiments, the memory system 20 includes more, fewer, or different components than shown in FIG. 1.

Figure 3:
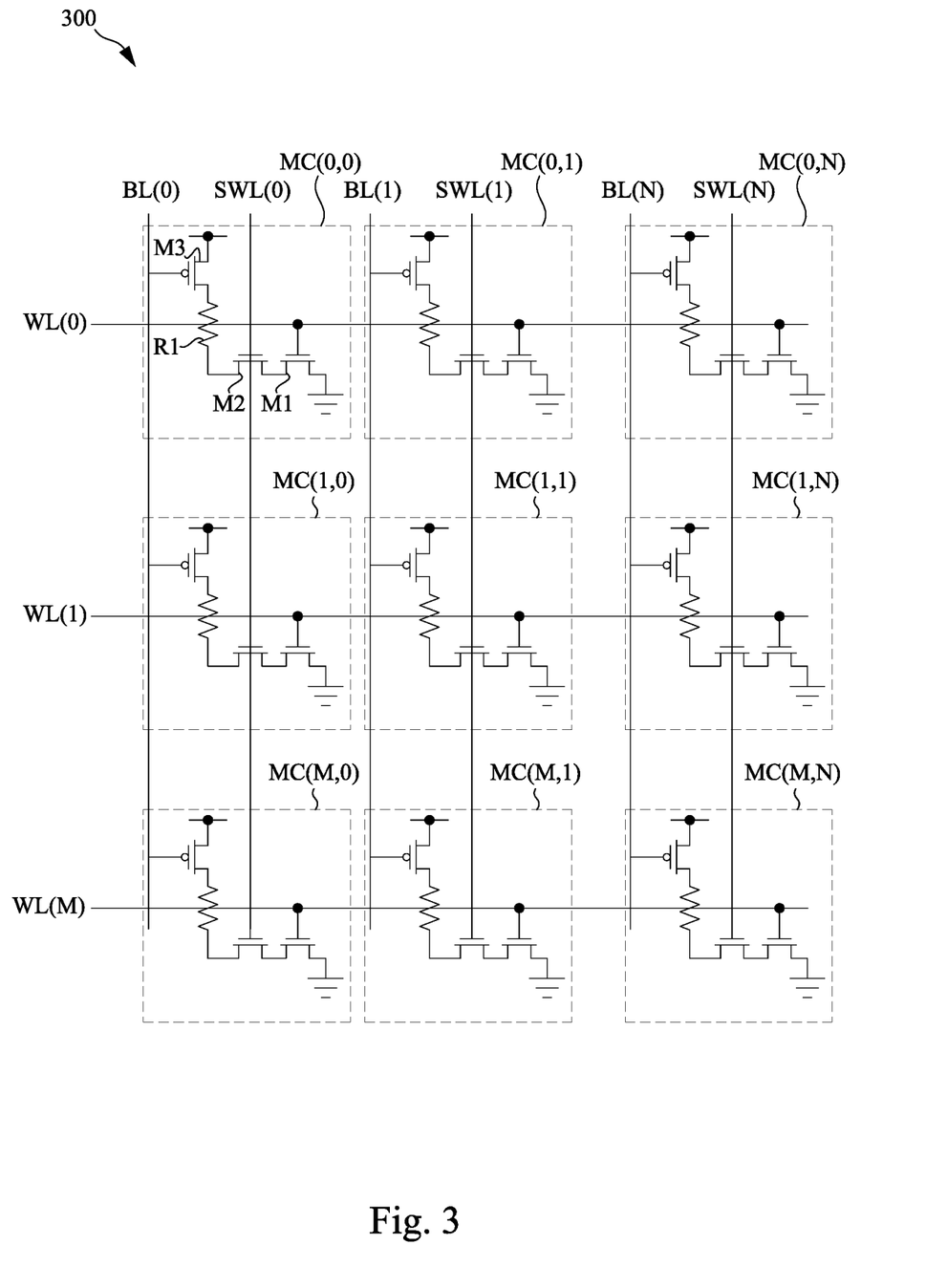
FIG. 3 illustrates a block diagram of a memory array, in accordance with some embodiments of the present disclosure.

FIG. 3 illustrates a block diagram of a memory array (e.g., memory device) 300, in accordance with some embodiments of the present disclosure. In some embodiments, the memory array 300 is similar to the memory array 200 except for showing some more detail. At a high level, the memory array 300 shows sub-components of each memory cell. In some embodiments, the memory array 300 includes a number of memory cells that can be arranged in a row-column configuration (e.g., M rows and N columns). For example, the memory array 300 includes a plurality of memory cells (e.g., MC(0,0), MC(1,0), MC(M,0), MC(0,1), MC(1,1), MC(M,1), MC(0,N), MC(1,N), MC(M,N), etc.) in which each column has a bit line (BL) and a second word line (SWL) and each row has a word line (WL). The BL and SWL of each column are respectively coupled to a plurality of memory cells that are disposed in that column, and each memory cell in that column is arranged on a different row and coupled to a respective (different) WL. In the same regard, the WL of each row is respectively coupled to a plurality of memory cells that are disposed in that row, and each memory cell in that row is arranged on a different column and coupled to a respective (different) BL and a respective (different) SWL. In some embodiments, each of the plurality of memory cells (such as MC(0,0)) are similar to respective ones of the plurality of memory cells (such as 200-1) of FIG. 2.

Referring still to FIG. 3, and in greater detail, nine memory cells (e.g., MC(0,0), MC(1,0), MC(M,0), MC(0,1), MC(1,1), MC(M,1), MC(0,N), MC(1,N), MC(M,N)) are shown in memory array 300 for illustration purposes. The memory cells MC(0,0), MC(1,0), MC(M,0) are arranged along a first column and coupled to BL(0) and SWL(0); the memory cells MC(0,1), MC(1,1), MC(M,1) are arranged along a second column and coupled to BL(1) and SWL(1); the memory cells MC(0,N), MC(1,N), MC(M,N) are arranged along a third column and coupled to BL(N) and SWL(N); the memory cells MC(0,0), MC(0,1), MC(0,N) are arranged along a first row and coupled to WL(0); the memory cells MC(1,0), MC(1,1), MC(1,N) are arranged along a second row and coupled to WL(1); and the memory cells MC(M,0), MC(M,1), MC(M,N) are arranged along a third row and coupled to WL(M).

As shown in FIG. 3, each memory cell includes a first transistor M1, a second transistor M2 coupled to the first transistor M1, a memory element (e.g., resistor) R1 coupled to the second transistor M2, and a third transistor M3 coupled to the memory element R1, wherein the respective WL is coupled to the first transistor M1, the respective SWL is coupled to the second transistor M2, and the respective BL is coupled to the third transistor M3. For example, the memory cell MC(0,0) includes transistor M1, transistor M2 coupled to transistor M1, resistor R1 coupled to transistor M2, and transistor M3 coupled to resistor R1. Specifically, in some embodiments, a drain of M1 is coupled to a source of M2, a drain of M2 is coupled to one end of R1, and a second end of R1 is coupled to a drain of M3. Further in the example, WL(0) is coupled to M1, SWL(0) is coupled to M2, and BL(0) is coupled to M3. Specifically, in some embodiments, WL(0) is coupled to a gate of M1, SWL(0) is coupled to a gate of M2, and BL(0) is coupled to a gate of M3. M1 can be referred to as a common source transistor, M2 can be referred to as a cascode transistor. M1 and M2 can be collectively referred to as stacked access transistors.

As shown in FIG. 3, the transistors M1 and M2 are each an n-type metal-oxide-semiconductor (NMOS) transistor and the transistor M3 is a p-type MOS (PMOS). However, in some embodiments, M1 and M2 are each a PMOS transistor and M3 is an NMOS transistor. Transistors M1, M2, and M3 can be any of other various transistor types while remaining within the scope of the present disclosure. The transistors M1, M2, and M3 can have a MOS device type of standard threshold voltage (SVT), low threshold voltage (LVT), high threshold voltage (HVT), high voltage (HV), input/output (IO), or any of various other MOS device types.

M1 (e.g., a source of M1) is coupled to a first reference line and M3 (e.g., a source of M3) is coupled to a second reference line. As shown in FIG. 3, M1 is coupled to ground (e.g., wherein the ground provides a first signal of 0 V) and M3 is coupled to a voltage supply line (e.g., wherein the voltage supply line provides a second signal having a voltage of a voltage/power supply/source). However, in some embodiments, M1 is coupled to the voltage supply line and M3 is coupled to the ground. M1 and M3 can be coupled to any of other various reference lines while remaining within the scope of the present disclosure.

As shown in FIG. 3, the memory element is a resistor (e.g., an eFuse resistor). However, the memory element may be a memristor, a capacitor, an inductor, or any of other various memory element types while remaining within the scope of the present disclosure.

In some embodiments, a write operation is performed by M1 receiving a word line signal, M2 receiving a second word line signal, and M3 receiving a bit line signal. As a result of a write operation, a state (e.g., resistance) of R1 is changed. In some embodiments, a read operation is performed by M1 receiving a word line signal, M2 receiving a second word line signal, and M3 sending a bit line signal. The state of can be determined based on a voltage (or current) level of the bit line signal. In some embodiments, the memory array 300 operates same as the memory array 200.

Figure 4:
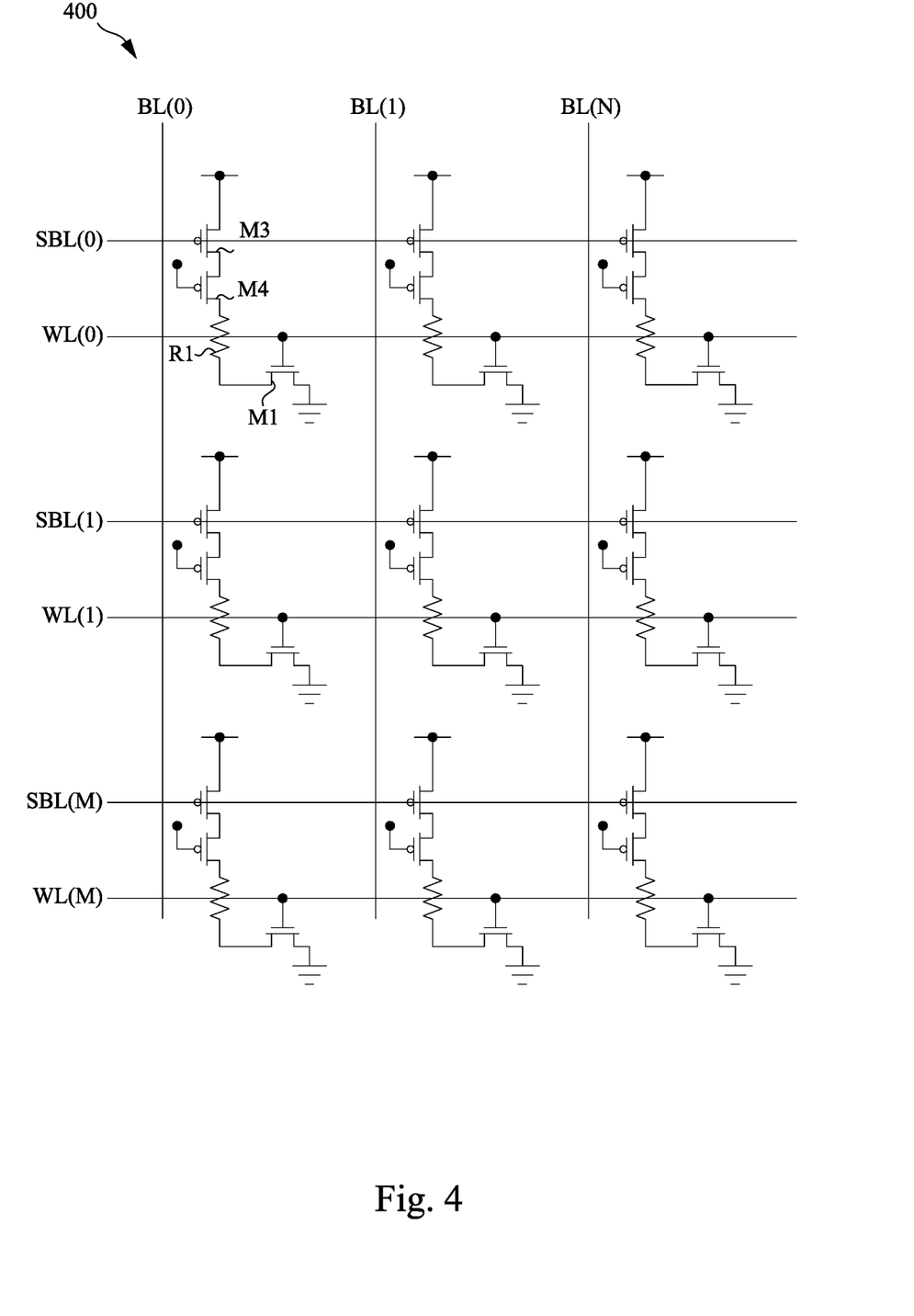
FIG. 4 illustrates a block diagram of another memory array, in accordance with some embodiments of the present disclosure.

FIG. 4 illustrates a block diagram of a memory array (e.g., memory device) 400, in accordance with some embodiments of the present disclosure. In some embodiments, the memory array 400 is similar to the memory array 300 except for differences described herein. At a high level, the differences include that each memory cell is coupled to a second bit line instead of a second word line. The memory array 400 includes a number of memory cells in which each column has a bit line (BL) and each row has a word line (WL) and a second bit line (SBL). In some embodiments, SWLs are omitted from the memory array 400. The BL is coupled to a plurality of memory cells that are disposed in that column, and each memory cell in that column is arranged on a different row and coupled to a respective (different) WL and a respective (different) SBL. Likewise, the WL and the SBL are coupled to a plurality of memory cells that are disposed in that row, and each memory cell in that row is arranged on a different column and coupled to a respective (different) BL.

As shown in FIG. 4, each memory cell includes a first transistor M1, a memory element (e.g., resistor) R1 coupled to the first transistor M1, a second transistor M4 coupled to the memory element R1, and a third transistor M3 coupled to the second transistor M4, wherein the respective WL is coupled to the first transistor M1, the respective SBL is coupled to the second transistor M4, and the respective BL is coupled to the third transistor M3. For example, the memory cell MC(0,0) includes transistor M1, resistor R1 coupled to transistor M1, transistor M4 coupled to resistor and transistor M3 coupled to transistor M4. Specifically, in some embodiments, a drain of M1 is coupled to one end of R1, a second end of R1 is coupled to a drain of M4, and a source of M4 is coupled to a drain of M3. Further in the example, WL(0) is coupled to M1, SBL(0) is coupled to M4, and BL(0) is coupled to M3. Specifically, in some embodiments, WL(0) is coupled to a gate of M1, SBL(0) is coupled to a gate of M4, and BL(0) is coupled to a gate of M3. In some embodiments, M1, M3, and R1 are instances of M1, M3, and R1 of FIG. 3.

As shown in FIG. 4, the transistors M1 is a n-type metal-oxide-semiconductor (NMOS) transistors and the transistors M3 and M4 are each a p-type MOS (PMOS). However, in some embodiments, M1 is a PMOS transistor and M3 and M4 are each an NMOS transistor. Transistors M1, M3, and M4 can be any of other various transistor types while remaining within the scope of the present disclosure. The transistors M1, M3, and M4 can have a MOS device type of standard threshold voltage (SVT), low threshold voltage (LVT), high threshold voltage (HVT), high voltage (HV), input/output (IO), or any of various other MOS device types.

In some embodiments, a write operation is performed by M1 receiving a word line signal, M3 receiving a bit line signal, and M4 receiving a second bit line signal. As a result of a write operation, a state (e.g., resistance) of R1 is changed. In some embodiments, a read operation is performed by M1 receiving a word line signal, M4 receiving a second bit line signal, and M3 sending a bit line signal. The state of R1 can be determined based on a voltage (or current) level of the bit line signal.

Figure 5:
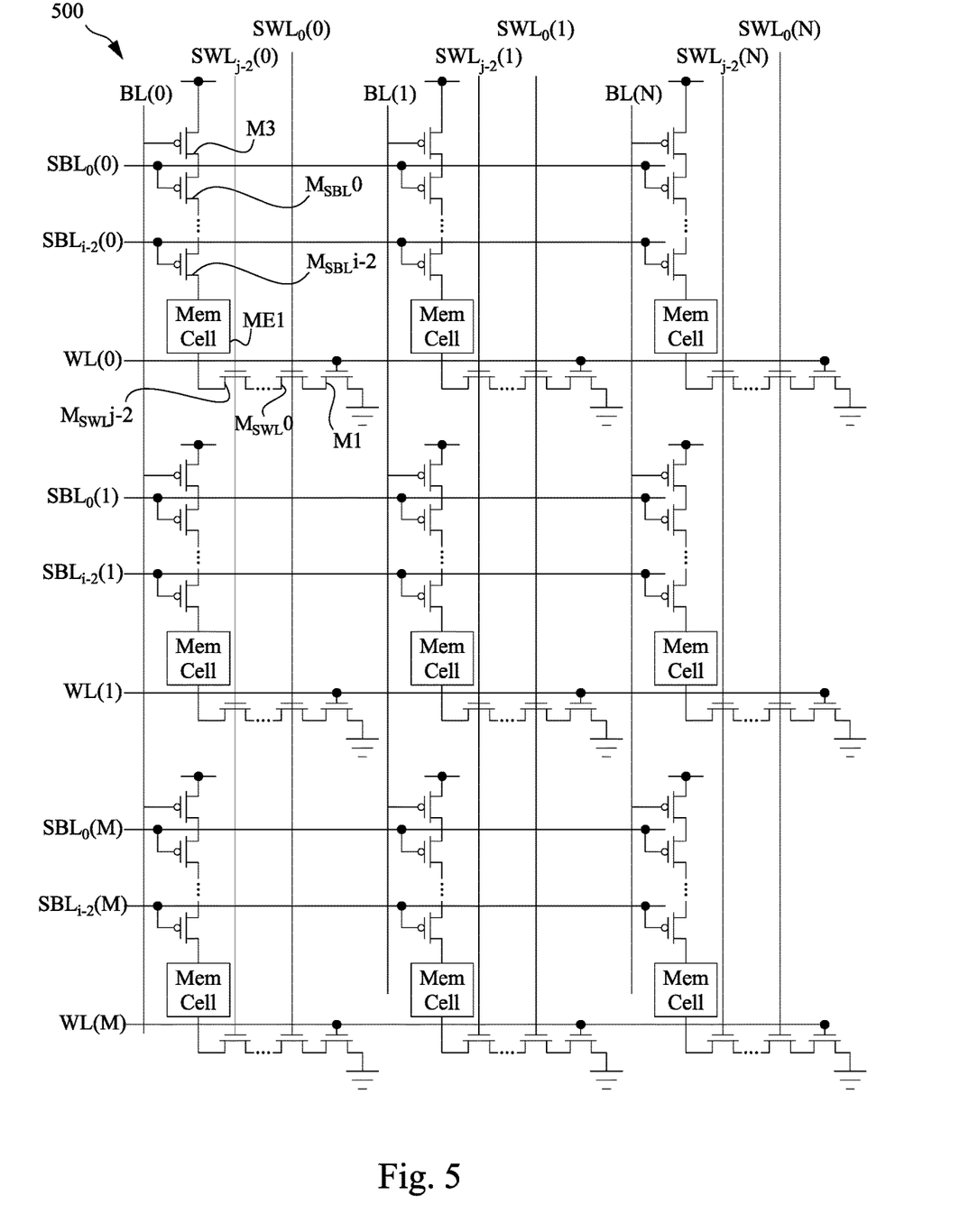
FIG. 5 illustrates a block diagram of yet another memory array, in accordance with some embodiments of the present disclosure.

FIG. 5 illustrates a block diagram of a memory array (e.g., memory device) 500, in accordance with some embodiments of the present disclosure. In some embodiments, the memory array 500 is similar to the memory array 300 except for differences described herein. At a high level, the differences include that each memory cell is coupled to a plurality of second word line sand a plurality of second bit lines. The memory array 500 includes a number of memory cells in which each column has a bit line (BL) and a number of second word lines ($SWL_0$ to $SWL_{j-2}$) and each row has a word line (WL) and a number of second bit lines ($SBL_0$ to $SBL_{i-2}$). The BL and $SWL_0$ to $SWL_{j-2}$ are coupled to a plurality of memory cells that are disposed in that column, and each memory cell in that column is arranged on a different row and coupled to a respective (different) WL and to respective (different) $SBL_0$ to $SBL_{i-2}$. In the same regard, the WL and the $SBL_0$ to $SBL_{i-2}$ are coupled to a plurality of memory cells that are disposed in that row, and each memory cell in that row is arranged on a different column and coupled to a respective (different) BL and to respective (different) $SWL_0$ to $SWL_{j-2}$.

As shown in FIG. 5, each memory cell includes a j number of transistors (M1, $M_{SWL}0$ ... $M_{SWL}j-2$) coupled in series, a memory element (e.g., resistor) ME1 coupled to $M_{SWL}j-2$, and an i number of transistors (M3, $M_{SBL}0$ ... $M_{SBL}i-2$) coupled in series with $M_{SBL}i-2$ coupled to the memory element, wherein the respective WL is coupled to M1, a number of respective SWLs coupled to the remaining j-1 transistors ($M_{SWL}0$ ... $M_{SWL}j-2$), the respective BL is coupled to M3, and a number of respective SBLs coupled to the remaining i-1 transistors ($M_{SBL}0$ ... $M_{SBL}i-2$).

For example, the memory cell MC(0,0) includes transistor M1, a transistor $M_{SWL}0$ coupled to the transistor M1, a transistor $M_{SWL}j-2$ coupled to the transistor $M_{SWL}0$, a memory element (e.g., resistor) ME1 coupled to the transistor $M_{SWL}j-2$, transistor $M_{SBL}i-2$ coupled to the memory element MEL a transistor $M_{SBL}0$ coupled to the transistor $M_{SBL}i-2$, and the transistor M3 coupled to the transistor $M_{SBL}0$. Specifically, in some embodiments, a drain of M1 is coupled to a source of $M_{SWL}0$, a drain of $M_{SWL}0$ is coupled to a source of $M_{SWL}j-2$, a drain of $M_{SWL}j-2$ is coupled a first end of the memory element MEL a second end of the memory element ME1 is coupled to a drain of $M_{SBL}i-2$, a source of $M_{SBL}i-2$ is coupled to a drain of $M_{SBL}0$, a source of $M_{SBL}0$ is coupled to a drain of M3.

Further in the example, WL(0) is coupled to M1, $SWL_0(0)$ is coupled to $M_{SWL}0$, $SWL_{j-2}(0)$ is coupled to $M_{SWL}j-2$, $SBL_{i-2}(0)$ is coupled to $M_{SBL}i-2$, $SBL_0(0)$ is coupled to $M_{SBL}0$, and BL(0) is coupled to M3. Specifically, in some embodiments, WL(0) is coupled to a gate of M1, $SWL_0(0)$ is coupled to a gate of $M_{SWL}0$, $SWL_{j-2}(0)$ is coupled to a gate of $M_{SWL}j-2$, $SBL_{i-2}(0)$ is coupled to a gate of $M_{SBL}i-2$, $SBL_0(0)$ is coupled to a gate of $M_{SBL}0$, and BL(0) is coupled to a gate of M3. In some embodiments, M1, M3, and ME1 are instances of M1, M3, and R1 of FIG. 3.

As shown in FIG. 5, the transistors M1, $M_{SWL}0$, and $M_{SWL}j-2$ are each an n-type metal-oxide-semiconductor (NMOS) transistor and the transistors $M_{SBL}0$, $M_{SBL}i-2$, and M3 are each a p-type MOS (PMOS). However, in some embodiments, M1, $M_{SWL}0$, and $M_{SWL}j-2$ are each a PMOS transistor and $M_{SBL}0$, $M_{SBL}i-2$, and M3 are each an NMOS transistor. Transistors M1, $M_{SWL}0$, $M_{SBL}0$, $M_{SBL}i-2$, and M3 can be any of other various transistor types while remaining within the scope of the present disclosure. The transistors M1, $M_{SWL}0$, $M_{SBL}0$, $M_{SBL}i-2$, and M3 can have a MOS device type of standard threshold voltage (SVT), low threshold voltage (LVT), high threshold voltage (HVT), high voltage (HV), input/output (IO), or any of various other MOS device types.

In some embodiments, a write operation is performed by M1 receiving a word line signal, each of $M_{SWL}0$ ... $M_{SWL}j-2$ receiving a respective second word line signal, M3 receiving a bit line signal, and each of $M_{SBL}0$ ... $M_{SBL}i-2$ receiving a respective second bit line signal. As a result of a write operation, a state (e.g., resistance) of ME1 is changed. In some embodiments, a read operation is performed by M1 receiving a word line signal, each of $M_{SWL}0$ ... $M_{SWL}j-2$ receiving a respective second word line signal, each of $M_{SBL}0$ ... $M_{SBL}i-2$ receiving a respective second bit line signal, and M3 sending a bit line signal. The state of ME1 can be determined based on a voltage (or current) level of the bit line signal.

Figure 6:
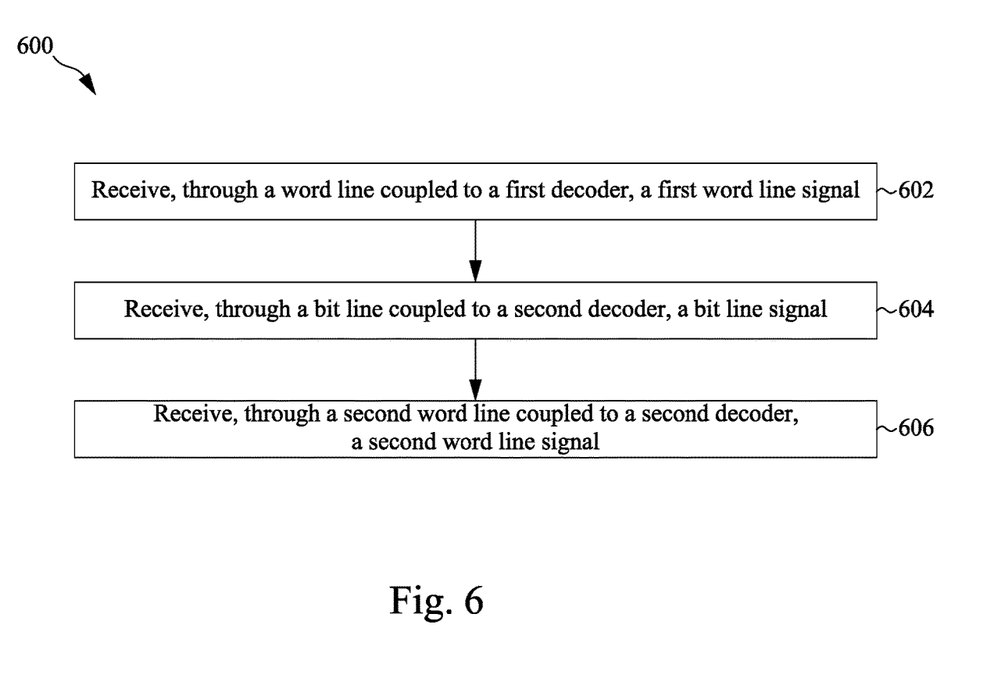
FIG. 6 illustrates a flowchart of a method to operate a memory device, in accordance with some embodiments of the present disclosure.

FIG. 6 illustrates a flowchart of a method 600 to operate a memory device, in accordance with some embodiments of the present disclosure. It is noted that the method 600 is merely an example and is not intended to limit the present disclosure. Accordingly, it is understood that additional operations may be provided before, during, and after the method 600 of FIG. 6, and that some other operations may only be briefly described herein. In some embodiments, the method 600 is performed by a memory array (e.g., the memory array 200, the memory array 300, the memory array 400, or the memory array 500). In some embodiments, operations of the method 600 may be associated with the memory device of FIGS. 1-5.

The method 600 starts with operation 602 of receiving, through a word line (e.g., WL(0)) coupled to a first decoder (e.g., the WL decoder 202), a first word line signal. The method 600 continues to operation 604 of receiving, through a bit line (e.g., BL(0)) coupled to a second decoder (e.g., the BL decoder 204), a bit line signal. In some embodiments, the method 600 continues to operation 606 of receiving, through a second word line (e.g., SWL(0)) coupled to the second decoder, a second word line signal. In some embodiments, the method 600 includes receiving, through a second bit line (e.g., SBL(0)) coupled to the first decoder, a second bit line signal.

In some aspects of the present disclosure, a memory device is disclosed. In some aspects, the memory device includes a plurality of memory cells arranged in a plurality of rows and a plurality of columns; a plurality of word lines, each of the word lines coupled to a corresponding row of the memory cells; a plurality of bit lines, each of the bit lines coupled to a corresponding column of the memory cells; and a plurality of second word lines, each of the second word lines coupled to a corresponding column of the memory cells.

In some aspects, the bit lines and the second word lines are coupled to a same decoder. In some aspects, the memory device further includes a plurality of second bit lines, each of the second bit lines coupled to a corresponding row of the memory cells. In some aspects, the memory device further includes a plurality of third word lines, each of the third word lines coupled to a corresponding column of the memory cells.

In some aspects, each of the memory cells includes: a first metal-oxide-semiconductor (MOS) transistor coupled to a corresponding word line; a second MOS transistor coupled to the first MOS transistor and a corresponding second word line; a memory element coupled to the second MOS transistor; and a third MOS transistor coupled to the memory element and a corresponding bit line. In some aspects, the memory element is a resistor.

In some aspects, the first MOS transistor and the second MOS transistor are n-type MOS (NMOS) transistors and the third MOS transistor is a p-type MOS (PMOS) transistor. In some aspects, the first MOS transistor and the second MOS transistor are PMOS transistors and the third MOS transistor is an NMOS transistor. In some aspects, each of the memory cells further includes a fourth MOS transistor coupled in between the third MOS transistor and the memory element, the fourth MOS transistor coupled to a corresponding second bit line. In some aspects, each of the memory cells further includes a fourth MOS transistor coupled in between the second MOS transistor and the memory element, the fourth MOS transistor coupled to a corresponding third word line.

In some aspects of the present disclosure, a memory system is disclosed. In some aspects, the memory system includes a plurality of memory cells, wherein each of the memory cells is coupled to a word line, a bit line, and a second word line; and a decoder coupled to the bit line of each of the memory cells and the second word line of each of the memory cells.

In some aspects, the memory cells are arranged in a plurality of rows and a plurality of columns; each row of memory cells is coupled to a corresponding word line; and each column of memory cells is are coupled to a corresponding bit line and second word line. In some aspects, each row of memory cells is coupled to a corresponding second bit line. In some aspects, each column of memory cells is coupled to a corresponding third word line.

In some aspects, each of the memory cells includes: a first metal-oxide-semiconductor (MOS) transistor coupled to a corresponding word line; a second MOS transistor coupled to the first MOS transistor and a corresponding second word line; a memory element coupled to the second MOS transistor; and a third MOS transistor coupled to the memory element and a corresponding bit line. In some aspects, the memory element is a resistor.

In some aspects, the first MOS transistor and the second MOS transistor are n-type MOS (NMOS) transistors and the third MOS transistor is a p-type MOS (PMOS) transistor. In some aspects, the first MOS transistor and the second MOS transistor are PMOS transistors and the third MOS transistor is an NMOS transistor.

In some aspects of the present disclosure, a method for operating a memory device is disclosed. In some aspects, the method includes receiving, through a word line coupled to a first decoder, a first word line signal; receiving, through a bit line coupled to a second decoder, a bit line signal; and receiving, through a second word line coupled to the second decoder, a second word line signal. In some embodiments, the method includes receiving, through a second bit line coupled to the first decoder, a second bit line signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
a plurality of memory cells arranged over a plurality of rows and a plurality of columns;
wherein each of the memory cells comprises:
a first metal-oxide-semiconductor (MOS) transistor coupled to a corresponding one of a plurality of first word lines, wherein the plurality of first word lines are arranged along the plurality of rows;
a second MOS transistor coupled to the first MOS transistor and a corresponding one of a plurality of second word lines, wherein the plurality of second word lines are arranged along the plurality of columns;

a memory element; and a third MOS transistor;

wherein the third MOS transistor, the memory element, the second MOS transistor, and the first MOS transistor are connected in series, and wherein the first MOS transistor and the second MOS transistor are one of n-type MOS (NMOS) transistors or p-type MOS (PMOS) transistors, and the third MOS transistor is another one of NMOS transistor or PMOS transistor different from the first and second MOS transistors.

2. The memory device of claim 1, wherein each of the first word lines is connected to the respective first MOS transistors of a first subset of the memory cells disposed along a corresponding one of the rows.

3. The memory device of claim 1, further comprising the plurality of second word lines arranged along the plurality of columns, respectively, wherein each of the second word lines is connected to the respective second MOS transistors of a second subset of the memory cells disposed along a corresponding one of the columns.

4. The memory device of claim 1, further comprising a plurality of bit lines arranged along the plurality of columns, respectively, wherein each of the bit lines is connected to the respective third MOS transistors of a third subset of the memory cells disposed along a corresponding one of the columns.

5. The memory device of claim 1, wherein the memory element is a resistor.

6. The memory device of claim 1, wherein the first MOS transistor and the second MOS transistor are each an NMOS transistor and the third MOS transistor is a PMOS transistor.

7. The memory device of claim 1, wherein the first MOS transistor and the second MOS transistor are each a PMOS transistor and the third MOS transistor is an NMOS transistor.

8. The memory device of claim 1, wherein each of the memory cells further comprises a fourth MOS transistor coupled in between the third MOS transistor and the memory element.

9. The memory device of claim 1, wherein each of the memory cells further comprises a fourth MOS transistor coupled in between the second MOS transistor and the memory element.

10. A memory device, comprising:
a first memory cell that comprises:
  a first metal-oxide-semiconductor (MOS) transistor coupled to a first one of a plurality of first word lines, wherein the plurality of first word lines are arranged along a row direction;
  a second MOS transistor coupled to the first MOS transistor and a first one of a plurality of second word lines, wherein the plurality of second word lines are arranged along a column direction;
  a memory element; and
  a third MOS transistor coupled to a first one of a plurality of bit lines;
  wherein the first MOS transistor, the second MOS transistor, the memory element, and the third MOS transistor are connected in series, and
  wherein the first MOS transistor and the second MOS transistor are one of n-type MOS (NMOS) transistors or p-type MOS (PMOS) transistors, and the third MOS transistor is another one of NMOS transistor or PMOS transistor different from the first and second MOS transistors.

11. The memory device of claim 10, further comprising:
a second memory cell that comprises:
  a fourth MOS transistor coupled to a second one of the plurality of first word lines;
  a fifth MOS transistor coupled to the first one of the plurality of second word lines;
  a second memory element; and
  a sixth MOS transistor coupled to the first one of the plurality of bit lines;
  wherein the fourth MOS transistor, the fifth MOS transistor, the second memory element, and the sixth MOS transistor are connected in series.

12. The memory device of claim 11, further comprising:
a third memory cell that comprises:
  a seventh MOS transistor coupled to the first one of the plurality of first word lines;
  an eighth MOS transistor coupled to a second one of the plurality of second word lines;
  a third memory element; and
  a ninth MOS transistor coupled to a second one of the plurality of bit lines;
  wherein the seventh MOS transistor, the eighth MOS transistor, the third memory element, and the ninth MOS transistor are connected in series.

13. The memory device of claim 12, wherein the first word lines extend along a first direction, while the second word lines and the bit lines extend along a second direction.

14. The memory device of claim 10, wherein the memory element is a resistor.

15. The memory device of claim 10, wherein the first MOS transistor and the second MOS transistor are each an NMOS transistor and the third MOS transistor is a PMOS transistor.

16. The memory device of claim 10, wherein the first MOS transistor and the second MOS transistor are each a PMOS transistor and the third MOS transistor is an NMOS transistor.

17. The memory device of claim 10, wherein the first memory cell further comprises a fourth MOS transistor coupled in between the third MOS transistor and the memory element.

18. The memory device of claim 10, wherein the first memory cell further comprises a fourth MOS transistor coupled in between the second MOS transistor and the memory element.

19. A memory device, comprising:
a plurality of memory cells arranged over a plurality of rows and a plurality of columns;
wherein each of the memory cells comprises:
  a first metal-oxide-semiconductor (MOS) transistor coupled to a corresponding one of a plurality of word lines, wherein the plurality of first word lines are arranged along the plurality of rows;
  a second MOS transistor coupled to the first MOS transistor and a corresponding one of a plurality of second word lines, wherein the plurality of second word lines are arranged along the plurality of columns;
  a memory element coupled to the second MOS transistor; and
  a third MOS transistor coupled to the memory element and a corresponding one of a plurality of bit lines;

wherein the third MOS transistor, the memory element, the second MOS transistor, and the first MOS transistor are connected in series, and wherein the first MOS transistor and the second MOS transistor are one of n-type MOS (NMOS) transistors or p-type MOS (PMOS) transistors, and the third MOS transistor is another one of NMOS transistor or PMOS transistor different from the first and second MOS transistors.

20. The memory device of claim 19, wherein the memory element is a resistor.

* * * * *